US012604636B2

(12) United States Patent
Han et al.

(10) Patent No.: US 12,604,636 B2
(45) Date of Patent: Apr. 14, 2026

(54) DISPLAY MODULE AND DISPLAY DEVICE

(71) Applicant: BOE Technology Group Co., Ltd., Beijing (CN)

(72) Inventors: Ziang Han, Beijing (CN); Zhengdao Liu, Beijing (CN); Song Zhang, Beijing (CN); Zhao Li, Beijing (CN); Paoming Tsai, Beijing (CN); Chunyan Xie, Beijing (CN); Haoran Wang, Beijing (CN); Biao Gao, Beijing (CN); Shuang Du, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 417 days.

(21) Appl. No.: 18/275,813

(22) PCT Filed: Aug. 16, 2022

(86) PCT No.: PCT/CN2022/112851
§ 371 (c)(1),
(2) Date: Aug. 4, 2023

(87) PCT Pub. No.: WO2024/036488
PCT Pub. Date: Feb. 22, 2024

(65) Prior Publication Data
US 2025/0017075 A1     Jan. 9, 2025

(51) Int. Cl.
*H10K 59/80*     (2023.01)
*H10K 102/00*     (2023.01)

(52) U.S. Cl.
CPC ....... *H10K 59/80* (2023.02); *H10K 2102/311* (2023.02)

(58) Field of Classification Search
CPC ..... H10K 59/80; H10K 2102/311; G09F 9/30
See application file for complete search history.

(56) References Cited

U.S. PATENT DOCUMENTS

| | | | | |
|---|---|---|---|---|
| 12,133,347 B2 * | 10/2024 | Wang | | H05K 5/04 |
| 2016/0037625 A1 | 2/2016 | Huitema et al. | | |
| 2018/0123083 A1 | 5/2018 | Im et al. | | |
| 2019/0363266 A1 | 11/2019 | Tanaka | | |
| 2021/0151697 A1 * | 5/2021 | Cao | | G06F 1/1652 |
| 2022/0238049 A1 * | 7/2022 | Min | | G09F 9/301 |
| 2022/0322542 A1 | 10/2022 | Wu | | |

(Continued)

FOREIGN PATENT DOCUMENTS

| | | |
|---|---|---|
| CN | 106031308 A | 10/2016 |
| CN | 206594962 U | 10/2017 |

(Continued)

*Primary Examiner* — J. E. Schoenholtz
(74) *Attorney, Agent, or Firm* — XSENSUS LLP

(57) ABSTRACT

Provided is a display module, which includes a display panel and a first support assembly disposed on a non-display side of the display panel. For each of a second support structure, a third support structure, and a fourth support structure of the first support assembly which are configured to support bending regions of the display panel, the thickness of the support structure is less than the thickness of a first support structure configured to support a non-bending region of the display panel, and/or the support structure configured to support bending regions of the display panel at least includes a target material with a lower elasticity modulus.

20 Claims, 8 Drawing Sheets

(56) References Cited

U.S. PATENT DOCUMENTS

| | | | | | |
|---|---|---|---|---|---|
| 2023/0049246 | A1* | 2/2023 | Wang | .................. | H10K 77/111 |
| 2024/0012453 | A1 | 1/2024 | Gwak et al. | | |
| 2024/0025141 | A1* | 1/2024 | Cheng | .................... | G09F 9/301 |
| 2024/0032411 | A1* | 1/2024 | Cheng | ................. | H10K 77/111 |

FOREIGN PATENT DOCUMENTS

| | | | |
|---|---|---|---|
| CN | 110199341 | A | 9/2019 |
| CN | 112037662 | A | 12/2020 |
| CN | 112991959 | A | 6/2021 |
| CN | 113851048 | A | 12/2021 |
| CN | 113888978 | A | 1/2022 |
| CN | 114170912 | A | 3/2022 |
| KR | 2020-0079956 | A | 7/2020 |
| WO | 2022/030789 | A1 | 2/2022 |
| WO | 2022/055185 | A1 | 3/2022 |

* cited by examiner

1023

1021

1024

10

108

107

106

101

104

105

102

1024

1022 h1 h4 h3 h7 h2 a1

102

1021

1023

1022

1024

1023
1021
a3
1022
1024

102

1021

1023

1022

1024

1023
1021
1022
1024
a4

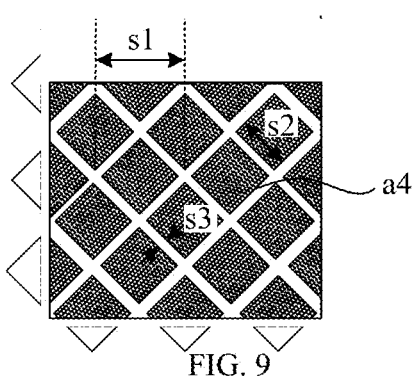
FIG. 9
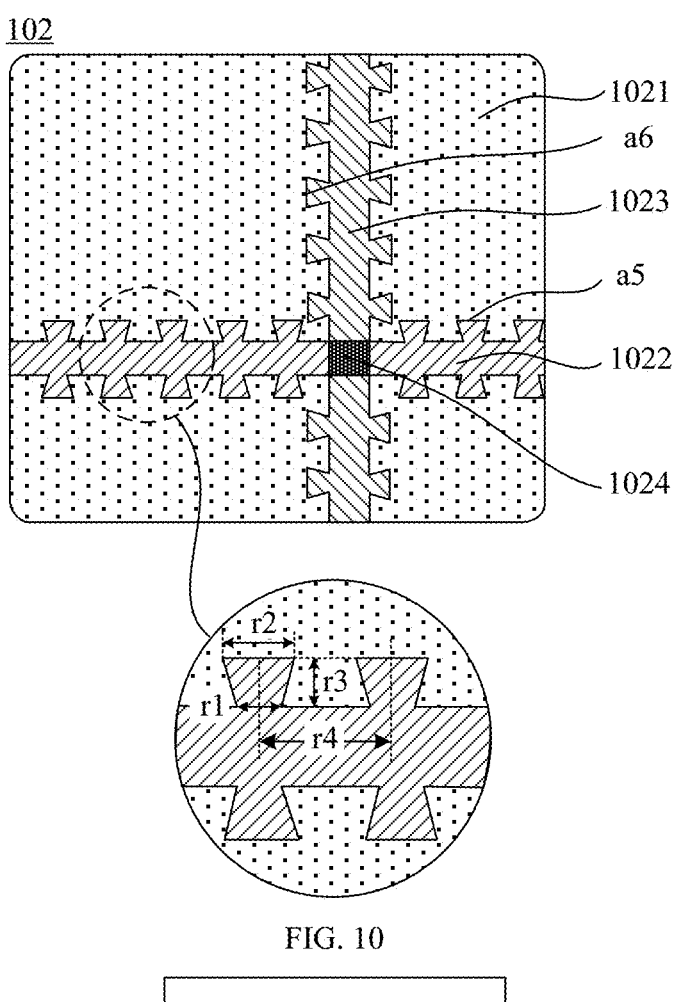
FIG. 10
FIG. 11

10

10

10

108
107
106
101
104
105
1022
103

1024

10

20

DISPLAY MODULE AND DISPLAY DEVICE

CROSS-REFERENCE TO RELATED APPLICATION

This application is a U.S. national stage of international application No. PCT/CN2022/112851, filed on Aug. 16, 2022, the disclosure of which is herein incorporated by reference in its entirety.

TECHNICAL FIELD

The present disclosure relates to the field of display technologies, and in particular to a display module and a display device.

BACKGROUND OF THE INVENTION

Organic light emitting diode (OLED) display panels can be used in foldable display devices because of their good bending performance.

SUMMARY OF THE INVENTION

The present disclosure provides a display module and a display device. The technical solutions are as follows.

In one aspect, a display module is provided. The display module includes:

a display panel provided with a non-bending region, a first bending region and a second bending region, wherein an extending direction of the first bending region intersects an extending direction of the second bending region, and an overlapping region of the first bending region and the second bending region is a double-bending region; and a first support assembly disposed on a non-display side of the display panel, wherein the first support assembly is of a plate-shaped structure and includes a first support structure, a second support structure, a third support structure, and a fourth support structure, wherein an orthographic projection of the first support structure on the display panel is in the non-bending region, an orthographic projection of the second support structure on the display panel is at least in the first bending region and is not in the double-bending region, an orthographic projection of the third support structure on the display panel is at least in the second bending region and is not in the double-bending region, and an orthographic projection of the fourth support structure on the display panel is at least in the double-bending region;

wherein a thickness of each of the second support structure, the third support structure, and the fourth support structure is less than a thickness of the first support structure, and/or a material of each of the second support structure, the third support structure, and the fourth support structure at least includes a target material, an elasticity modulus of the target material being less than an elasticity modulus of the material of the first support structure; and the target material is acquired by filling and curing a liquid material.

In some embodiments, the thickness of the second support structure and the thickness of the third support structure are equal, and both are less than the thickness of the first support structure; and the thickness of the fourth support structure is less than or equal to the thickness of the second support structure, wherein the material of the fourth support structure at least includes the target material.

In some embodiments, the material of the second support structure and the material of the third support structure both are the same as the material of the first support structure, and the material of the fourth support structure is the target material; and a first groove is formed in a sidewall of the second support structure close to the fourth support structure, a second groove is formed in a sidewall of the third support structure close to the fourth support structure, and part of the fourth support structure is disposed in the first groove and the second groove.

In some embodiments, an orthographic projection of the first groove on a first reference plane has an axisymmetric shape, an axis of the orthographic projection of the first groove on the first reference plane is overlapped with an axis of an orthographic projection of the second support structure on the first reference plane, and the first reference plane is perpendicular to a support surface of the first support assembly and parallel to an extending direction of the second support structure; and an orthographic projection of the second groove on a second reference plane has an axisymmetric shape, an axis of the orthographic projection of the second groove on the second reference plane is overlapped with an axis of an orthographic projection of the third support structure on the second reference plane, and the second reference plane is perpendicular to the support surface and parallel to an extending direction of the third support structure.

In some embodiments, a length of the first groove along the direction perpendicular to a support surface of the first support assembly and a length of the second groove along the direction perpendicular to the support surface are less than or equal to the thickness of the second support structure.

In some embodiments, the material of the second support structure and the material of the third support structure are both the same as the material of the first support structure, the material of the fourth support structure is the target material, and the fourth support structure is provided with a plurality of third grooves.

In some embodiments, the material of the second support structure, the material of the third support structure, and the material of a first part of the fourth support structure are all the same as the material of the first support structure, and the material of a second part of the fourth support structure is the target material; and the first part of the fourth support structure forms a plurality of fourth grooves, and the material of the second part of the fourth support structure is disposed in the plurality of fourth grooves.

In some embodiments, two adjacent rows of fourth grooves of the plurality of fourth grooves are staggered.

In some embodiments, the material of each of the second support structure, the third support structure, and the fourth support structure at least includes the target material.

In some embodiments, the material of the second support structure, the material of the third support structure, and the material of the fourth support structure are all the target materials; and a plurality of fifth grooves are formed in a sidewall of the first support structure close to the second support structure, a plurality of sixth grooves are formed in a sidewall of the first support structure close to the third support structure, part of the second support structure is disposed in the plurality of fifth grooves, and part of the third support structure is disposed in the plurality of sixth grooves.

In some embodiments, the plurality of fifth grooves and the plurality of sixth grooves penetrate through the first support structure along a direction perpendicular to a support surface of the first support assembly.

In some embodiments, orthographic projections of the plurality of fifth grooves on the support surface and orthographic projections of the plurality of sixth grooves on the support surface have the same shape.

In some embodiments, the material of a first part of the second support structure and the material of a first part of the third support structure are the same as the material of the first support structure, and the material of a second part of the second support structure, the material of a second part of the third support structure, and the material of the fourth support structure are all the target material;

wherein the first part of the second support structure and the second part of the second support structure are laminated, and the first part of the third support structure and the second part of the third support structure are laminated.

In some embodiments, the thickness of the second support structure, the thickness of the third support structure, and the thickness of the fourth support structure are all equal and are all less than or equal to the thickness of the first support structure.

In some embodiments, the material of the second support structure, the material of the third support structure, and the material of the fourth support structure are all the target material; and the thickness of the second support structure and the thickness of the third support structure are both less than or equal to the thickness of the first support structure, and the thickness of the fourth support structure is greater than or equal to the thickness of the second support structure.

In some embodiments, the first support structure is made from one of steel use stainless, titanium alloy, aluminum alloy, carbon fiber plates, polyethylene terephthalate, and polyimide.

In some embodiments, the target material is one of thermoplastic polyurethane elastomer rubber, polymethyl methacrylate, and organic silicone.

In some embodiments, the first support structure is made from polyethylene terephthalate or polyimide, and the display module further includes: a second support assembly; wherein the second support assembly is of a plate-shaped structure and is disposed on a side, distal from the display panel, of the first support assembly; and the material of the second support assembly at least includes a metal material.

In some embodiments, the display panel is an organic light emitting diode display panel.

In another aspect, a display device is provided. The display device includes: a power supply assembly and the display module described in the above aspect; wherein the power supply assembly is configured to supply power to the display module.

BRIEF DESCRIPTION OF THE DRAWINGS

For clearer descriptions of the technical solutions according to the embodiments of the present disclosure, the drawings required for describing the embodiments are briefly introduced below. The drawings in the following descriptions are merely some embodiments of the present disclosure, and those of ordinary skill in the art may derive other drawings based on these drawings without creative effort.

FIG. 9 is a schematic diagram of a fourth support structure in the first support assembly shown in FIG. 8;

FIG. 10 is a top view of yet still another first support assembly according to some embodiments of the present disclosure;

FIG. 11 is a schematic diagram of a fifth groove or a sixth groove according to some embodiments of the present disclosure;

DETAILED DESCRIPTION

For clearer descriptions of the objective, technical solutions, and advantages of the present disclosure, the embodiments of the present disclosure are further described in detail below with reference to the accompanying drawings.

In the related art, the foldable display device may be a bidirectional foldable display device. The bidirectional foldable display device is a novel foldable display device that can be folded in two directions that cross each other. Compared with the traditional unidirectional foldable display device, the bidirectional foldable display device improves the user experience.

However, because the film layer material at the intersection of the two folding directions in the bidirectional foldable display device needs to bear the alternating stress from the two directions at the same time, the module debonding, the failure of a light emitting device in a display panel or the like easily occurs, and the yield of the display module is low.

Figure 1:
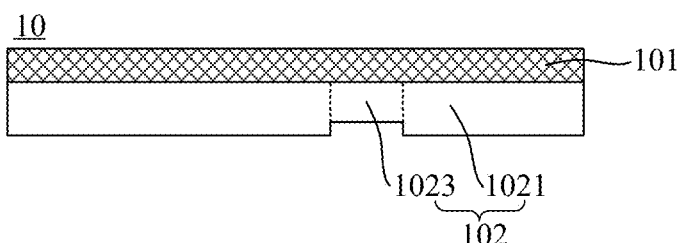
FIG. 1 is a schematic structural diagram of a display module according to some embodiments of the present disclosure.

FIG. 1 is a schematic structural diagram of a display module according to some embodiments of the present disclosure. As can be seen from FIG. 1, the display module 10 includes a display panel 101 and a first support assembly 102 located at a non-display side of the display panel 101.

Figure 2:
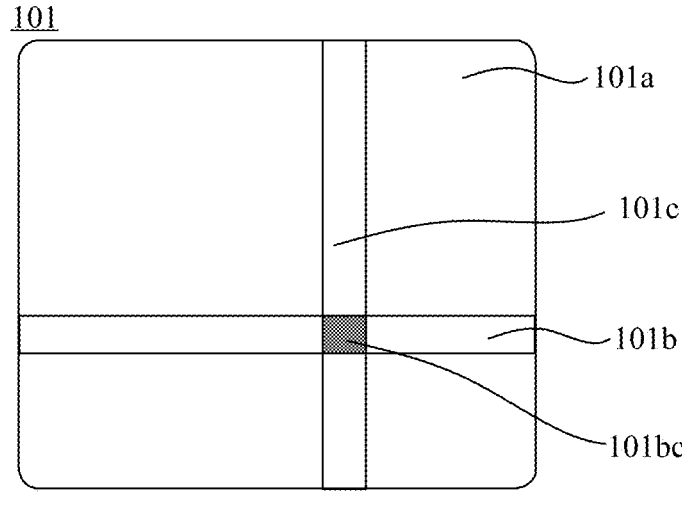
FIG. 2 is a top view of a display panel according to some embodiments of the present disclosure.

FIG. 2 is a top view of a display panel according to some embodiments of the present disclosure. Referring to FIG. 2, the display panel 101 is provided with a non-bending region 101*a*, a first bending region 101*b*, and a second bending region 101*c*. The non-bending region 101*a* is referred to as a normal display region. An extending direction of the first bending region 101*b* intersects an extending direction of the second bending region 101*c*. For example, the extending direction of the first bending region 101*b* is perpendicular to the extending direction of the second bending region 101*c* in FIG. 2.

An overlapping region of the first bending region 101*b* and the second bending region 101*c* is a double-bending region 101*bc*. The display panel 101 is foldable in the first bending region 101*b* along the extending direction of the first bending region 101*b*, and is foldable in the second bending region 101*c* along the extending direction of the second bending region 101*c*.

Figure 3:
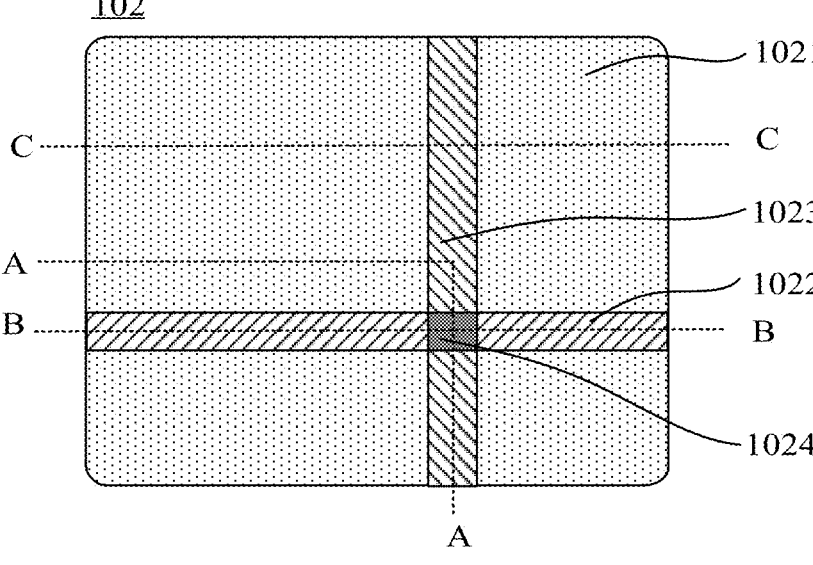
FIG. 3 is a top view of a first support assembly according to some embodiments of the present disclosure.

FIG. 3 is a top view of a first support assembly according to some embodiments of the present disclosure. Referring to FIG. 3, the first support assembly 102 is of a plate-shaped structure, and the first support assembly 102 includes a first support structure 1021, a second support structure 1022, a third support structure 1023, and a fourth support structure 1024. An orthographic projection of the first support structure 1021 on the display panel 101 is in the non-bending region 101*a*, and is configured to support the non-bending region 101*a*. An orthographic projection of the second support structure 1022 on the display panel 101 is at least in the first bending region 101*b* and is not in the double-bending region 101*bc*. The second support structure 1022 is configured to support the region of the first bending region 101*b* that does not belong to the double-bending region 101*bc*. An orthographic projection of the third support structure 1023 on the display panel 101 is at least in the second bending region 101*c* and is not in the double-bending region 101*bc*. The third support structure 1023 is configured to support the region of the second bending region 101*c* that does not belong to the double-bending region 101*bc*. An orthographic projection of the fourth support structure 1024 on the display panel 101 is at least in the double-bending region 101*bc*, and is configured to support the double-bending region 101*bc*.

In some embodiments, the shape of the fourth support structure 1024 configured to support the double-bending region 101*bc* is rectangular or circular, and the shape of the fourth support structure 1024 is not limited in the embodiments of the present disclosure.

In the embodiments of the present disclosure, the thickness of each of the second support structure 1022, the third support structure 1023, and the fourth support structure 1024 is less than the thickness of the first support structure 1021, and/or the material of each of the second support structure 1022, the third support structure 1023, and the fourth support structure 1024 at least includes a target material. The target material has a lower elasticity modulus than the material of the first support structure 1021, that is, the target material has better flexibility than the material of the first support structure 1021. The target material is acquired by filling and curing a liquid material.

The thickness of each of the second support structure 1022, the third support structure 1023, and the fourth support structure 1024 being less than the thickness of the first support structure 1021, and/or the material of each of the second support structure 1022, the third support structure 1023, and the fourth support structure 1024 at least including a target material have the following three meanings: the thickness of each of the second support structure 1022, the third support structure 1023, and the fourth support structure 1024 is less than the thickness of the first support structure 1021, and the material of each of the second support structure 1022, the third support structure 1023, and the fourth support structure 1024 at least includes the target material; or, the thickness of each of the second support structure 1022, the third support structure 1023, and the fourth support structure 1024 is less than the thickness of the first support structure 1021, and the material of each of the second support structure 1022, the third support structure 1023, and the fourth support structure 1024 does not include the target material; or, the thickness of each of the second support structure 1022, the third support structure 1023, and the fourth support structure 1024 is greater than or equal to the thickness of the first support structure 1021, and the material of each of the second support structure 1022, the third support structure 1023, and the fourth support structure 1024 at least includes the target material.

The thickness of the support structure is the length of the support structure along a direction perpendicular to a support surface of the first support assembly 102. The material of the support structure at least including the target material refers to a part of the material of the support structure is the target material, and the other part of the material is not the target material, or all of the material of the support structure is the target material.

Figure 4:
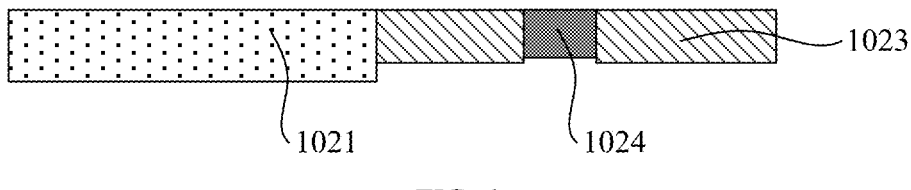
FIG. 4 is a cross-sectional view along a direction AA of FIG. 3.

For example, FIG. 1 shows the first support structure 1021 and the third support structure 1023 in the first support assembly 102, and the thickness of the third support structure 1023 is less than the thickness of the first support structure 1021. FIG. 4 is a cross-sectional view along a direction AA of FIG. 3. Referring to FIG. 4, the thickness of the third support structure 1023 and the thickness of the fourth support structure 1024 are both less than the thickness of the first support structure 1021. In addition, the thickness of the second support structure 1022 is also less than the thickness of the first support structure 1021.

In the embodiments of the present disclosure, the first support assembly 102 is provided on the non-display side of the display module 10, such that the display panel 101 can be effectively supported, and the supporting effect is better. Moreover, the thickness of each of the second support structure 1022, the third support structure 1023, and the fourth support structure 1024 for supporting the bending regions is less than the thickness of the first support structure 1021 for supporting the non-bending region 101*a*, and/or the material of each of the second support structure 1022, the third support structure 1023, and the fourth support structure 1024 at least includes the target material having a lower elasticity modulus than the material of the first support structure 1021. Thus, when the display module 10 is bent, the bending stress of the display module 10 in the bending regions is smaller, especially in the double-bending region 101*bc*, thereby avoiding the defects of film layer debonding, device failure and the like of the display module 10 in the bending regions.

Moreover, the target material is acquired by filling and curing a liquid material, the preparation method is simple, and the adhesion of the support structures to other structures can be ensured, which ensures the yield of the first support assembly 102.

In summary, the embodiments of the present disclosure provide a display module. The display module includes a display panel and a first support assembly located on the non-display side of the display panel. By providing the first support assembly on the non-display side of the display panel, the display panel can be effectively supported, and the supporting effect is better. The thickness of each of the second support structure, the third support structure, and the fourth support structure for supporting the bending regions of the display panel in the first support assembly is less than the thickness of the first support structure, and/or, each of the second support structure, the third support structure, and the fourth support structure at least includes a target material having a lower elasticity modulus. Thus, the bending stress of the display module in the bending regions is smaller, which avoids the defects of film layer debonding, device failure and the like of the display module in the bending regions. Therefore, the yield of display module is higher, and the display effect is better.

In the embodiments of the present disclosure, the thickness of the second support structure 1022 is equal to the thickness of the third support structure 1023, and the thickness of the second support structure 1022 and the thickness of the third support structure 1023 are both less than the thickness of the first support structure 1021. The thickness of the fourth support structure 1024 is less than or equal to the thickness of the second support structure 1022. The material of the fourth support structure 1024 at least includes the target material.

By setting the thickness of the second support structure 1022 to be less than the thickness of the first support structure 1021, in the case that the display module 10 is bent in the first bending region 101*b* along the extending direction of the first bending region 101*b*, the bending stiffness of the second support structure 1022 is lower, which ensures the yield of the display module 10 after being bent in the first bending region 101*b*. Similarly, by setting the thickness of the third support structure 1023 to be less than the thickness of the first support structure 1021, in the case that the display module 10 is bent in the second bending region 101*c* along the extending direction of the second bending region 101*c*, the bending stiffness of the third support structure 1023 is lower, which ensures the yield of the display module 10 after being bent in the second bending region 101*c*.

In addition, as the display module 10 can be bent in two directions (the extending direction of the first bending region 101*b* and the extending direction of the second bending region 101*c*), the region (the double-bending region 101*bc*) of the display module 10 which is at the intersection of the two bending directions is more easily affected by the bending stress. Thus, the fourth support structure 1024 at least includes the target material with a lower elasticity modulus, such that the flexibility of the fourth support structure 1024 is improved, the display module 10 well adapts to and bear the alternating stress from the two directions in the bidirectional folding process. Therefore, the film layer debonding, fracture and the like of the display module 10 in the bending process are avoided, and yield and reliability of the display module 10 are improved.

Alternatively, in the embodiments of the present disclosure, the material of each of the second support structure

1022, the third support structure 1023, and the fourth support structure 1024 at least includes the target material.

As the material of each of the second support structure 1022, the third support structure 1023, and the fourth support structure 1024 at least includes the target material, and the elasticity modulus of the target material is lower, and the flexibility is better, when the display module 10 is bent, the bending stiffness of the first support assembly 102 is lower, and the display module 10 can well adapt to and bear the alternating stress from the two directions in the bidirectional folding process. Therefore, the film layer debonding, fracture and the like of the display module 10 in the bending process are avoided, and yield and reliability of the display module 10 are improved.

As a first alternative implementation, the material of the second support structure 1022 and the material of the third support structure 1023 are both the same as the material of the first support structure 1021, and the material of the fourth support structure 1024 is the target material. That is, the material of the second support structure 1022 and the material of the third support structure 1023 do not include the target material, and the material of the fourth support structure 1024 only includes the target material.

Figure 5:
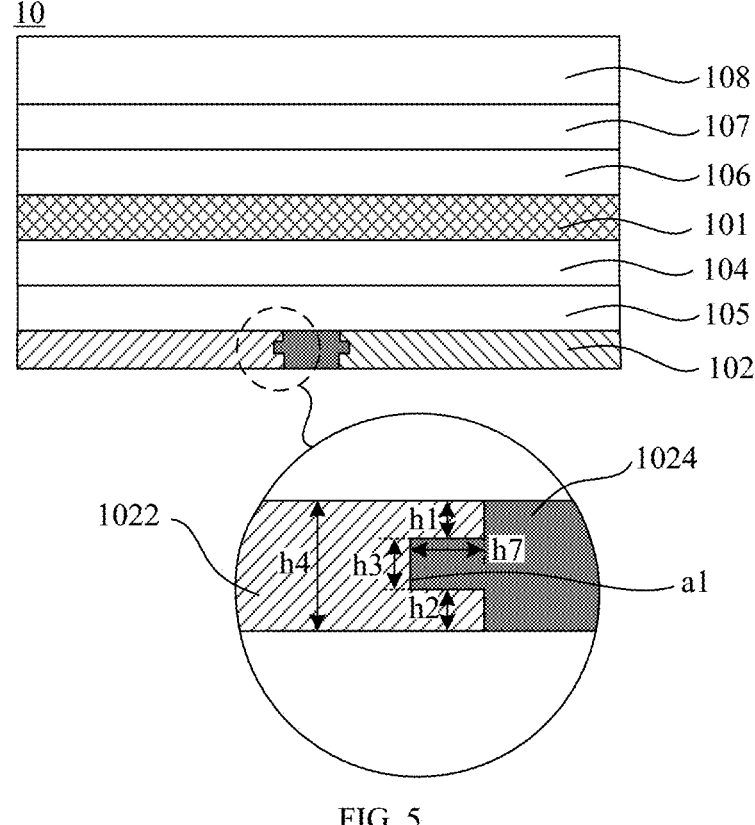
FIG. 5 is a schematic structural diagram of another display module according to some embodiments of the present disclosure.
Figure 6:
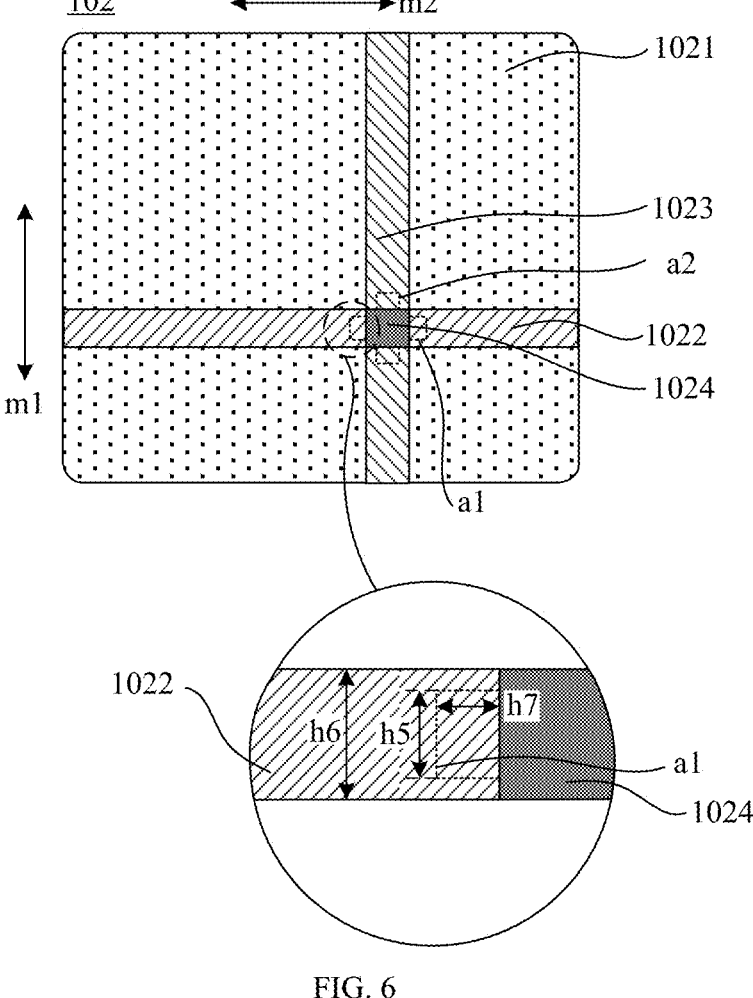
FIG. 6 is a top view of the first support assembly in the display module shown in FIG. 5.

FIG. 5 is a schematic structural diagram of another display module according to some embodiments of the present disclosure; and FIG. 6 is a top view of the first support assembly in the display module shown in FIG. 5. Referring to FIG. 5 and FIG. 6, a first groove a1 is formed in a sidewall of the second support structure 1022 close to the fourth support structure 1024, and a second groove a2 is formed in a sidewall of the third support structure 1023 close to the fourth support structure 1024. Part of the fourth support structure 1024 is disposed in the first groove a1 and the second groove a2.

Referring to FIG. 5, an orthographic projection of the first groove a1 on a first reference plane has an axisymmetric shape, and an axis of the orthographic projection of the first groove a1 on the first reference plane is overlapped with an axis of an orthographic projection of the second support structure 1022 on the first reference plane. The first reference plane is perpendicular to the support surface of the first support assembly 102 and parallel to the extending direction of the second support structure 1022. That is, the first groove a1 is in the middle of the second support structure 1022 in the direction perpendicular to the support surface of the first support assembly 102.

Exemplarily, in FIG. 5, the orthographic projection of the first groove a1 on the first reference plane is rectangular. The distance h1 between one face of the first groove a1 close to a first face of the second support structure 1022 and the first face of the second support structure 1022 is equal to the distance h2 between another face of the first groove a1 close to a second face of the second support structure 1022 and the second face of the second support structure 1022, that is, h1=h2. The first face of the second support structure 1022 and the second face of the second support structure 1022 are two surfaces perpendicular to the support surface of the first support assembly 102. Alternatively, it can be also understood that the first face of the second support structure 1022 and the second face of the second support structure 1022 are two surfaces perpendicular to the light emitting direction of the display panel 101. Certainly, the orthographic projection of the first groove a1 on the first reference plane may also have other shapes, which is not limited in the embodiments of the present disclosure.

Corresponding to the first groove a1, an orthographic projection of the second groove a2 on a second reference plane also has an axisymmetric shape, and an axis of the orthographic projection of the second groove a2 on the second reference plane is overlapped with an axis of an orthographic projection of the third support structure 1023 on the second reference plane. The second reference plane is perpendicular to the support surface of the first support assembly 102 and parallel to the extending direction of the third support structure 1023. That is, the second groove a2 is in the middle of the third support structure 1023 in the direction perpendicular to the support surface of the first support assembly 102.

Exemplarily, the orthographic projection of the second groove a2 on the second reference plane is rectangular. The distance between one face of the second groove a2 close to a first face of the third support structure 1023 and the first face of the third support structure 1023 is equal to the distance between another face of the second groove a2 close to a second face of the third support structure 1023 and the second face of the third support structure 1023. Certainly, the orthographic projection of the second groove a2 on the second reference plane may also have other shapes, which is not limited in the embodiments of the present disclosure.

In addition, the first groove a1 and the second groove a2 are formed together by the same process, and the shape of the first groove a1 is the same as the shape of the second groove a2.

In some embodiments, the length h3 of the first groove a1 along the direction perpendicular to the support surface and the length of the second groove a2 along the direction perpendicular to the support surface are less than or equal to the thickness h4 of the second support structure 1022. That is, the first groove a1 and the second groove a2 are non-through grooves in the direction perpendicular to the support surface (e.g., the first groove a1 shown in FIG. 5 is a non-through groove). Alternatively, the first groove a1 and the second groove a2 are through grooves in the direction perpendicular to the support surface.

In the case that the first groove a1 is a non-through groove, the distance h1 between one face of the first groove a1 close to the first face of the second support structure 1022 and the first face of the second support structure 1022 and the distance h2 between another face of the first groove a1 close to the second face of the second support structure 1022 and the second face of the second support structure 1022 are both greater than 5 μm (micrometers) and less than 10 μm, that is, 5 μm<h1=h2<10 μm. The second groove a2 is similar to the first groove a1, and details are not described herein again.

In some embodiments, the length h5 of the orthographic projection of the first groove a1 on the support surface along a first target direction m1 is greater than half of the length h6 of the second support structure 1022 along the first target direction m1 (the length of the second support structure 1022 along the first target direction m1 is the width of the second support structure 1022), and less than the length h6 of the second support structure 1022 along the first target direction m1. The first target direction m1 is perpendicular to the extending direction of the second support structure 1022. For example, in FIG. 6, 1/2h6<h5<h6.

Correspondingly, the length of the orthographic projection of the second groove a2 on the support surface along a second target direction m2 is greater than half of the length of the third support structure 1023 along the second target direction m2 (the length of the third support structure 1023 along the second target direction m2 is the width of the third support structure 1023), and less than the length of the third support structure 1023 along the second target direction m2.

The second target direction m2 is perpendicular to the extending direction of the third support structure 1023.

In some embodiments, the depth h7 of the first groove a1 and the depth of the second groove a2 are greater than 5 μm, to ensure that enough material of the fourth support structure 1024 is located within the first groove a1 and the second groove a2, thereby ensuring the adhesion of the fourth support structure 1024 to the second support structure 1022 and the third support structure 1023, and ensuring the yield of the first support assembly 102.

The depth h7 of the first groove a1 is the length of the first groove a1 in the extending direction of the second support structure 1022, and the depth of the second groove a2 is the length of the second groove a2 in the extending direction of the third support structure 1023.

In the first implementation, the thickness of the first support structure 1021 ranges from 20 μm to 300 μm, for example, 200 μm. The first support structure 1021 is made from one of steel use stainless (SUS), titanium alloy, aluminum alloy, carbon fiber plates, polyethylene terephthalate (PET), and polyimide (PI), for example, steel use stainless. The thickness of the second support structure 1022 and the thickness of the third support structure 1023 are less than the thickness of the first support structure 1021, and are 30 μm, for example. The thickness of the second support structure 1022 and the thickness of the third support structure 1023 are smaller, which is beneficial to bending. The width of the second support structure 1022 and the width of the third support structure 1023 are equal, which range from 5 μm to 40 μm. The material of the second support structure 1022 and the material of the third support structure 1023 are the same as the material of the first support structure 1021, and are steel use stainless, for example. The second support structure 1022 and the third support structure 1023 are of an integral structure with the first support structure 1021. The thickness of the fourth support structure 1024 is less than or equal to the thickness of the second support structure 1022, and the material of the fourth support structure 1024 is the target material, which is a flexible high polymer filler or an elastomeric high-molecular polymer. The elasticity modulus of the material ranges from tens to hundreds of Mpa (megapascals) and is much less than the elasticity modulus of the material of the first support structure 1021 (the elasticity modulus of the material of the first support structure 1021 ranges from 3 GPa (gigapascals) to 6 GPa). Therefore, the target material is softer and has smaller stress during bending than the material of the first support structure 1021, which can prevent the film layer debonding or fracture of the display module 10 in the double-bending region 101bc. In some embodiments, the target material is one of thermoplastic polyurethane elastomer (TPU), polymethyl methacrylate (PMMA), and organic silicone. For example, the target material is ultraviolet (UV) curing PMMA, the preparation process thereof is simple, and the elasticity modulus is below 500 MPa.

By taking an example where the first support structure 1021 has a thickness of 200 μm and the second support structure 1022 and the third support structure 1023 have a thickness of 30 μm, the first support assembly 102 is prepared by the following steps: acquiring a plate with a thickness of 200 μm; etching the parts of the plate which are located in the first bending region 101b and the second bending region 101c (including the double-bending region 101bc) until the remaining thickness after etching is 30 μm to acquire the second support structure 1022 and the third support structure 1023; continuously etching the part of the plate which is located in the double-bending region 101bc into a through hole; etching the sidewall of the through hole to form the first groove a1 and the second groove a2; and filling the through hole, the first groove a1, and the second groove a2 with a liquid target material and curing the liquid target material to acquire the fourth support structure 1024. In this way, the target material infiltrates into the first groove a1 and the second groove a2, thereby forming a tooth-shaped mechanism between the fourth support structure 1024 and the second support structure 1022 and between the fourth support structure 1024 and the third support structure 1023. Thus, the bonding force between the support structures is increased, and the peeling phenomenon between the support structures when the display module 10 is bent is avoided.

As a second alternative implementation, the material of the second support structure 1022 and the material of the third support structure 1023 are both the same as the material of the first support structure 1021, and the material of the fourth support structure 1024 is the target material. That is, the material of the second support structure 1022 and the material of the third support structure 1023 do not include the target material, and the material of the fourth support structure 1024 only includes the target material. In addition, a plurality of third grooves a3 are formed in the fourth support structure 1024. By forming the plurality of third grooves a3 in the fourth support structure 1024, the alternating stress of the display module 10 during bending can be further reduced, and the yield of the display module 10 is ensured.

Figures 7, 8:
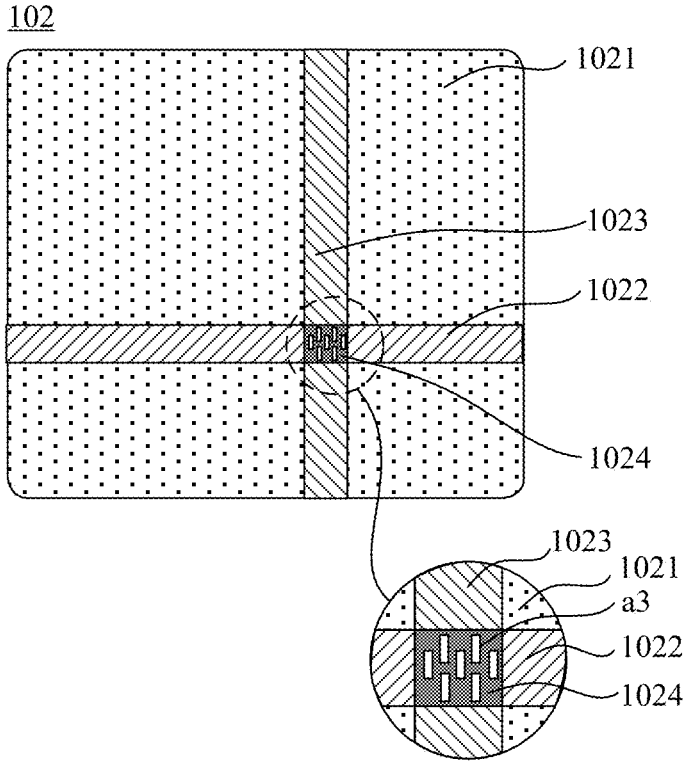
FIG. 7 is a top view of another first support assembly according to some embodiments of the present disclosure.
FIG. 8 is a top view of still another first support assembly according to some embodiments of the present disclosure.

Referring to FIG. 7, two adjacent rows of the third grooves a3 of the plurality of third grooves a3 are staggered. The orthographic projections of the plurality of third grooves a3 on the support surface have the same shape, and are all rectangular, for example. Certainly, the orthographic projections of the plurality of third grooves a3 on the support surface may also have other shapes, which is not limited in the embodiments of the present disclosure.

The lengths of the plurality of third grooves a3 in the direction perpendicular to the support surface are equal to the length of the fourth support structure 1024 in the direction perpendicular to the support surface, that is, the plurality of third grooves a3 are all through grooves in the direction perpendicular to the support surface.

In the second implementation, the material of the first support structure 1021 is one of SUS, titanium alloy, aluminum alloy, carbon fiber plates, PET, and PI, for example, titanium alloy. The thickness of the second support structure 1022 and the thickness of the third support structure 1023 are less than the thickness of the first support structure 1021, and are 30 μm, for example. The thickness of the second support structure 1022 and the thickness of the third support structure 1023 are smaller, which is beneficial to bending. The width of the second support structure 1022 and the width of the third support structure 1023 are equal, which range from 5 μm to 40 μm. The material of the second support structure 1022 and the material of the third support structure 1023 are the same as the material of the first support structure 1021, and are titanium alloy, for example. The second support structure 1022 and the third support structure 1023 are of an integral structure with the first support structure 1021. The thickness of the fourth support structure 1024 is less than or equal to the thickness of the second support structure 1022, and the material of the fourth support structure 1024 is the target material. The target material is a flexible high polymer filler or an elastomeric high-molecular polymer. The elasticity modulus of the material ranges from tens of Mpa to hundreds of Mpa, which is much less than the elasticity modulus of the material of the first support structure 1021 (the elasticity modulus of the material of the first support structure 1021 ranges from 3 GPa to 6 GPa). Therefore, the target material is softer and has smaller stress during bending than the material of the first support structure 1021, which can prevent the film layer debonding or fracture of the display module 10 in the double-bending region 101bc. In some embodiments, the target material is one of TPU, PMMA, and organic silicone. For example, the target material is ultraviolet (UV) curing PMMA, the preparation process thereof is simple, and the elasticity modulus is below 500 MPa.

By taking an example where the first support structure 1021 has a thickness of 200 μm and the second support structure 1022 and the third support structure 1023 have a thickness of 30 μm, the first support assembly 102 is prepared by the following steps: acquiring a plate with a thickness of 200 μm; etching the parts of the plate which are located in the first bending region 101b and the second bending region 101c (including the double-bending region 101bc) until the remaining thickness after etching is 30 μm to acquire the second support structure 1022 and the third support structure 1023; continuously etching the part of the plate into a through hole; filling the through hole with a liquid target material and curing the liquid target material; and patterning the cured target material to form the plurality of third grooves a3 in the fourth support structure 1024.

As a third alternative implementation, the material of the second support structure 1022, the material of the third support structure 1023, and the material of a first part of the fourth support structure 1024 are all the same as the material of the first support structure 1021, and the material of a second part of the fourth support structure 1024 is the target material. That is, the material of the second support structure 1022 and the material of the third support structure 1023 do not include the target material, and the material of fourth support structure 1024 includes other materials in addition to the target material.

Referring to FIG. 8, the first part of the fourth support structure 1024 forms a plurality of fourth grooves a4, and the material of the second part of the fourth support structure 1024 is in the plurality of fourth grooves a4.

In some embodiments, two adjacent rows of the fourth grooves a4 of the plurality of fourth grooves a4 are staggered. Orthographic projections of the plurality of fourth grooves a4 on the support surface have a diamond shape. Certainly, the orthographic projections of the plurality of fourth grooves a4 on the support surface may also be in other shapes, such as a circle or an ellipse, which is not limited in the embodiments of the present disclosure.

Exemplarily, referring to FIG. 9, in the case that the plurality of fourth grooves a4 are diamond-shaped, the distance s1 between groove centers of adjacent two fourth grooves a4 ranges from 2 mm (millimeters) to 10 mm, the length s2 of each side of the fourth groove a4 ranges from 2 mm to 10 mm, and the distance s3 between adjacent two fourth grooves a4 (i.e., the width of an unetched part between adjacent two grooves) ranges from 1 mm to 5 mm.

In the third implementation, the thickness of the first support structure 1021 ranges from 20 μm to 300 μm, for example, 200 μm. The first support structure 1021 is made from one of SUS, titanium alloy, aluminum alloy, carbon fiber plates, PET, and PI, for example, SUS. The thickness of the second support structure 1022 and the thickness of the third support structure 1023 are less than the thickness of the first support structure 1021, and are 30 μm, for example. The thickness of the second support structure 1022 and the thickness of the third support structure 1023 are smaller, which is beneficial to bending. The width of the second support structure 1022 and the width of the third support structure 1023 are equal, which range from 5 μm to 30 μm. The material of the second support structure 1022 and the material of the third support structure 1023 are the same as the material of the first support structure 1021, and are SUS, for example. The second support structure 1022 and the third support structure 1023 are of an integral structure with the first support structure 1021. The thickness of the fourth support structure 1024 is less than or equal to the thickness of the second support structure 1022, and the material of the fourth support structure 1024 includes the target material, which is a flexible high polymer filler or an elastomeric high-molecular polymer. The elasticity modulus of the material ranges from tens of Mpa to hundreds of Mpa, which is much less than the elasticity modulus of the material of the first support structure 1021 (the elasticity modulus of the material of the first support structure 1021 ranges from 3 GPa to 6 GPa). Therefore, the target material is softer and has smaller stress during bending than the material of the first support structure 1021, which can prevent the film layer debonding or fracture of the display module 10 in the double-bending region 101bc. In some embodiments, the target material is one of TPU, PMMA, and organic silicone. For example, the target material is ultraviolet (UV) curing PMMA, the preparation process thereof is simple, and the elasticity modulus is below 500 MPa.

By taking an example where the first support structure 1021 has a thickness of 200 μm and the second support structure 1022 and the third support structure 1023 have a thickness of 30 μm, the first support assembly 102 is prepared by the following steps: acquiring a plate with a thickness of 200 μm; etching the parts of the plate which are located in the first bending region 101b and the second bending region 101c (including the double-bending region 101bc) until the remaining thickness after etching is 30 μm to acquire the second support structure 1022 and the third support structure 1023; patterned etching the part of the plate which is located in the double-bending region 101bc, to form the plurality of fourth grooves a4 in the part of the plate which is located in the double-bending region 101bc; and filling the plurality of fourth grooves a4 with the liquid target material and curing the liquid target material to form the fourth support structure 1024.

As a fourth alternative implementation, the material of the second support structure 1022, the material of the third support structure 1023, and the material of the fourth support structure 1024 are all the target material. That is, the material of the second support structure 1022, the material of the third support structure 1023, and the material of the fourth support structure 1024 only include the target material, and do not include other materials.

Referring to FIG. 10, a plurality of fifth grooves a5 are formed in a sidewall of the first support structure 1021 close to the second support structure 1022, and a plurality of sixth grooves a6 are formed in a sidewall of the first support structure 1021 close to the third support structure 1023. Part of the second support structure 1022 is disposed in the plurality of fifth grooves a5 and part of the third support structure 1023 is disposed in the plurality of sixth grooves a6.

By forming the plurality of fifth grooves a5 and the plurality of sixth grooves a6 in the first support structure 1021, and disposing the second support structure 1022 within the plurality of fifth grooves a5 and disposing the third support structure 1023 within the plurality of sixth grooves a6, the adhesion between the second support structure 1022 and the first support structure 1021 and between the third support structure 1023 and the first support structure 1021 is ensured, thereby ensuring the yield of the first support assembly 102.

Referring to FIG. 10, the plurality of fifth grooves a5 are uniformly distributed in the sidewall of the first support structure 1021 close to the second support structure 1022, and the plurality of fifth grooves a5 are symmetrically disposed about the extending direction of the second support structure 1022. Furthermore, the plurality of sixth grooves a6 are uniformly distributed in the sidewall of the first support structure 1021 close to the third support structure 1023, and the plurality of sixth grooves a6 are symmetrically arranged about the extending direction of the third support structure 1023.

In some embodiments, the orthographic projections of the plurality of fifth grooves a5 on the support surface and the orthographic projections of the plurality of sixth grooves a6 on the support surface have the same shape, which can ensure the symmetry of the first support assembly 102. Certainly, the orthographic projections of the plurality of fifth grooves a5 on the support surface and the orthographic projections of the plurality of sixth grooves a6 on the support surface have different shapes, which is not limited in the embodiments of the present disclosure.

Referring to FIG. 10, for each of the plurality of fifth grooves a5 and the plurality of sixth grooves a6, the orthographic projection of the groove on the support surface is trapezoidal. The length of the groove close to an opening of the groove is less than the length of the groove distal from the opening of the groove. The length r1 of the groove close to the opening of the groove and the length r2 of the groove distal from the opening of the groove both range from 0.1 mm to 20 mm, and the distance r3 (the groove depth of the groove) from the side of the groove close to the opening of the groove and the side of the groove distal from the opening of the groove ranges from 0.2 mm to 20 mm. The distance r4 between the axes of two adjacent grooves ranges from 0.5 mm to 30 mm.

Figure 12:
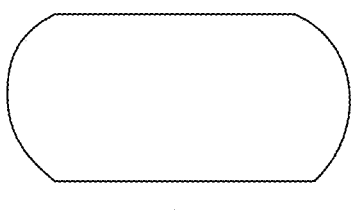
FIG. 12 is a schematic diagram of another fifth groove or sixth groove according to some embodiments of the present disclosure.
Figure 13:
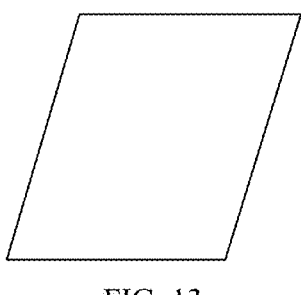
FIG. 13 is a schematic view of still another fifth groove or sixth groove according to some embodiments of the present disclosure.

In some embodiments, in addition to the trapezoid, the orthographic projections of the plurality of fifth grooves a5 and the plurality of sixth grooves a6 on the support surface are in other shapes, for example, in the shape of a rectangle shown in FIG. 11, in the shape of a strip with two arc-shaped ends shown in FIG. 12, or in the shape of a parallelogram shown in FIG. 13, etc., which is not limited in the embodiments of the present disclosure. In the case that the fifth grooves a5 and the sixth grooves a6 are in the shape of a parallelogram, an angle between one side of the fifth groove a5 and the extending direction of the second support structure 1022 and an angle between one side of the sixth groove a6 and the extending direction of the third support structure 1023 both range from 30° (degrees) to 150°.

In some embodiments, the plurality of fifth grooves a5 and the plurality of sixth grooves a6 all penetrate through the first support structure 1021 along the direction perpendicular to the support surface. That is, the length of the fifth groove a5 along the direction perpendicular to the support surface and the length of the sixth groove a6 along the direction perpendicular to the support surface are both equal to the thickness of the first support structure 1021. The plurality of fifth grooves a5 and the plurality of sixth grooves a6 are all through grooves.

In the fourth implementation, the thickness of the first support structure 1021 ranges from 20 μm to 300 μm, for example, 100 μm. The first support structure 1021 is made from one of SUS, titanium alloy, aluminum alloy, carbon fiber plates, polyethylene terephthalate, and polyimide, for example, carbon fiber plates. The thickness of the second support structure 1022, the thickness of the third support structure 1023, and the thickness of the fourth support structure 1024 are all equal, and are all less than or equal to the thickness of the first support structure 1021. The material of the second support structure 1022, the material of the third support structure 1023, and the material of the fourth support structure 1024 are flexible high polymer fillers or elastomeric high-molecular polymers. The elasticity modulus of the material ranges from tens of Mpa to hundreds of Mpa, which is much less than the elasticity modulus of the material of the first support structure 1021 (the elasticity modulus of the material of the first support structure 1021 ranges from 3 GPa to 6 GPa). Therefore, the target material is softer and has smaller stress during bending than the material of the first support structure 1021, which can prevent the film layer debonding or fracture of the display module 10 in the double-bending region 101*bc*. In some embodiments, the target material is one of TPU, PMMA, and organic silicone. For example, the target material is ultraviolet (UV) curing PMMA, the preparation process thereof is simple, and the elasticity modulus is below 500 MPa.

By taking an example where the first support structure 1021 has a thickness of 100 μm, the first support assembly 102 is prepared by the following steps: acquiring a plate with a thickness of 100 μm; etching parts of the plate which are located in the first bending region 101*b* and the second bending region 101*c* (including the double-bending region 101*bc*) to form through holes which include the plurality of fifth grooves a5 and the plurality of sixth grooves a6; and filling the through holes, the plurality of fifth grooves a5, and the plurality of sixth grooves a6 with the liquid target material and curing the liquid target material to form the second support structure 1022, the third support structure 1023, and the fourth support structure 1024. In this way, the target material infiltrates into the plurality of fifth grooves a5 and the plurality of sixth grooves a6, thereby forming the tooth-shaped mechanism between the second support structure 1022 and the first support structure 1021 and between the third support structure 1023 and the first support structure 1021. Thus, the bonding force between the support structures is increased, and the peeling phenomenon between the support structures during bending of the display module 10 is avoided.

As a fifth alternative implementation, the material of a first part of the second support structure 1022 and the material of a first part of the third support structure 1023 are the same as the material of the first support structure 1021, and the material of a second part of the second support structure 1022, the material of a second part of the third support structure 1023, and the material of the fourth support structure 1024 are all the target material. That is, the material of the second support structure 1022 and the material of the third support structure 1023 includes the target material and other materials. The material of the fourth support structure 1024 only includes the target material.

Figure 14:
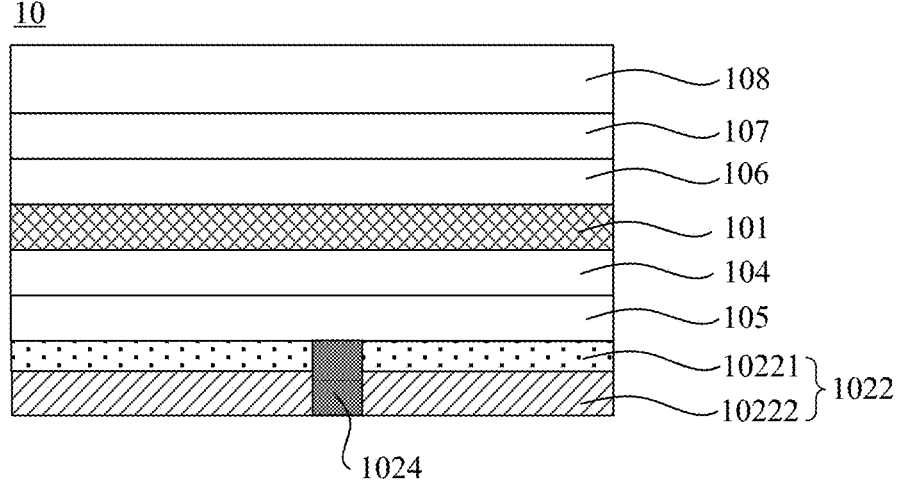
FIG. 14 is a cross-sectional view of a display module along a direction BB in FIG. 3 according to some embodiments of the present disclosure.
Figure 15:
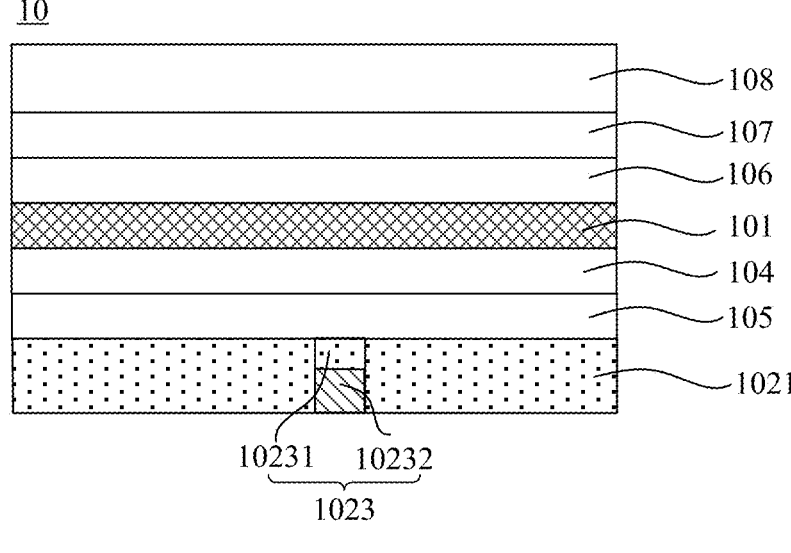
FIG. 15 is a cross-sectional view of a display module along a direction CC in FIG. 3 according to some embodiments of the present disclosure.

FIG. 14 is a cross-sectional view of a display module along the direction BB shown in FIG. 3 according to some embodiments of the present disclosure. FIG. 15 is a cross-sectional view of a display module along the direction CC in shown FIG. 3 according to some embodiments of the present disclosure. Referring to FIG. 14 and FIG. 15, the first part 10221 of the second support structure 1022 and the second part 10222 of the second support structure 1022 are laminated. Accordingly, similar to the second support structure

1022, and the first part 10231 of the third support structure 1023 and the second part 10232 of the third support structure 1023 are laminated.

The first part 10221 of the second support structure 1022, the first part 10231 of the third support structure 1023, and the first support structure 1021 are of an integral structure. The second part 10222 of the second support structure 1022, the second part 10232 of the third support structure 1023, and the fourth support structure 1024 are prepared together.

In the fifth implementation, the thickness of the first support structure 1021 ranges from 20 μm to 300 μm, for example, 200 μm. The first support structure 1021 is made from one of SUS, titanium alloy, aluminum alloy, carbon fiber plates, PET, and PI, for example, SUS. The thickness of the first part 10221 of the second support structure 1022 and the thickness of the first part 10231 of the third support structure 1023 are both less than the thickness of the first support structure 1021. The thickness of the second support structure 1022, the thickness of the third support structure 1023, and the thickness of the fourth support structure 1024 are all equal, and are less than or equal to the thickness of the first support structure 1021. The width of the second support structure 1022 and the width of the third support structure 1023 are equal, and range from 5 μm to 40 μm. The material of the first part 10221 of the second support structure 1022 and the material of the first part 10231 of the third support structure 1023 are the same as the material of the first support structure 1021, and are made from SUS, for example. The material of the second part 10222 of the second support structure 1022, the material of the second part 10232 of the third support structure 1023, and the material of the fourth support structure 1024 are the target material. The target material is a flexible high polymer filler or an elastomeric high-molecular polymer. The elasticity modulus of the material ranges from tens of Mpa to hundreds of Mpa, which is much less than the elasticity modulus of the material of the first support structure 1021 (the elasticity modulus of the material of the first support structure 1021 ranges from 3 GPa to 6 GPa). Therefore, the target material is softer and has smaller stress during bending than the material of the first support structure 1021, which can prevent the film layer debonding or fracture of the display module 10 in the double-bending region 101*bc*. In some embodiments, the target material is one of TPU, PMMA, and organic silicone. For example, the target material is ultraviolet (UV) curing PMMA, the preparation process thereof is simple, and the elasticity modulus is below 500 MPa.

By taking an example where the first support structure 1021 has a thickness of 200 μm, the first part 10221 of the second support structure 1022 has a thickness of 20 μm, and the first part 10231 of the third support structure 1023 has a thickness of 20 μm, the first support assembly 102 is prepared by the following steps: acquiring a plate with a thickness of 200 μm; etching the parts of the plate which are located in the first bending region 101*b* and the second bending region 101*c* (including the double-bending region 101*bc*) until the remaining thickness after etching is 20 μm; continuously etching the part of the plate which is located in the double-bending region 101*bc* into a through hole; and filling the etched region of the plate with the liquid target material and curing the liquid target material. The etched region includes a region with a remaining thickness of 20 μm after etching and the through hole.

In addition, in this implementation, grooves are also formed in the sidewall of the first support structure 1021 close to the second support structure 1022 and the sidewall of the first support structure close to the third support structure 1023. For the design of the grooves, please refer to the fourth implementation above, and the difference lies in that in this implementation, the length of the grooves along the direction perpendicular to the support surface is less than the size of the first support structure 1021. For example, the length of the grooves along the direction perpendicular to the support surface is equal to the thickness of the second part 10222 of the second support structure 1022.

As a sixth alternative implementation, the material of the second support structure 1022, the material of the third support structure 1023, and the material of the fourth support structure 1024 are all the target material. That is, the material of the second support structure 1022, the material of the third support structure 1023, and the material of the fourth support structure 1024 all only include the target material.

Figure 16:
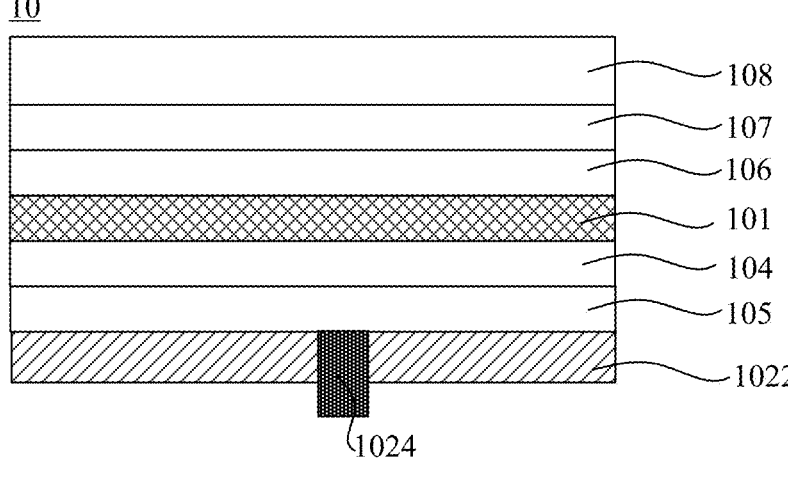
FIG. 16 is a cross-sectional view of another display module along the direction BB in FIG. 3 according to some embodiments of the present disclosure.

In some embodiments, the thickness of the second support structure 1022 and the thickness of the third support structure 1023 are both less than or equal to the thickness of the first support structure 1021, and the thickness of the fourth support structure 1024 is greater than or equal to the thickness of the second support structure 1022. For example, referring to FIG. 16, the thickness of the second support structure 1022 and the thickness of the third support structure 1023 are both equal to the thickness of the first support structure 1021, and the thickness of the fourth support structure 1024 is greater than the thickness of the second support structure 1022.

As the fourth support structure 1024 protrudes a certain height relative to the second support structure 1022 and the third support structure 1023, the fourth support structure 1024 can effectively support dents generated in the double-bending region 101bc when the display module 10 is bent.

In the sixth implementation, the thickness of the first support structure 1021 ranges from 20 μm to 300 μm, for example, 200 μm. The material of the first support structure 1021 is one of SUS, titanium alloy, aluminum alloy, carbon fiber plates, PET, and PI, for example, PET. The thickness of the second support structure 1022 and the thickness of the third support structure 1023 are equal to the thickness of the first support structure 1021, and are 200 μm, for example. The width of the second support structure 1022 and the width of the third support structure 1023 are equal, and range from 5 μm to 40 μm. The thickness of the fourth support structure 1024 is greater than the thickness of the second support structure 1022. The material of the second support structure 1022, the material of the third support structure 1023, and the material of the fourth support structure 1024 are the target material. The target material is a flexible high polymer filler or an elastomeric high-molecular polymer. The elasticity modulus of the material ranges from tens of Mpa to hundreds of Mpa, which is much less than the elasticity modulus of the material of the first support structure 1021 (the elasticity modulus of the material of the first support structure 1021 ranges from 3 GPa to 6 GPa). Therefore, the target material is softer and has smaller stress during bending than the material of the first support structure 1021, which can prevent the film layer debonding or fracture of the display module 10 in the double-bending region 101bc. In some embodiments, the target material is one of TPU, PMMA, and organic silicone. For example, the target material is ultraviolet (UV) curing PMMA, the preparation process thereof is simple, and the elasticity modulus is below 500 MPa.

By taking an example where the first support structure 1021, the second support structure 1022, and the third support structure 1023 have a thickness of 200 μm, and the thickness of the fourth support structure 1024 is greater than the thickness of the second support structure 1022, the first support assembly 102 is prepared by the following steps: acquiring a plate with a thickness of 200 μm; etching the parts of the plate which are located in the first bending region 101b and the second bending region 101c (including the double-bending region 101bc) into through holes; filling the regions in the first bending region 101b (including the double-bending region 101bc) of the through holes with the liquid target material and curing the liquid target material; and filling the regions in the second bending region 101c (including the double-bending region 101bc) of the through holes with the liquid target material and curing the liquid target material. In this way, the double-bending region 101bc is filled twice with the target material, and the thickness of the formed fourth support structure 1024 is greater than the thickness of the second support structure 1022.

In the embodiments of the present disclosure, in the case that the first support structure 1021 is made from PET or PI, the first support assembly 102 is an organic support assembly. Thus, in order to ensure the reliable support for the display panel 101, referring to FIG. 17, the display module 10 further includes a second support assembly 103.

The second support assembly 103 is of a plate-shaped structure, and the second support assembly 103 is disposed on the side of the first support assembly 102 distal from the display panel 101. The material of the second support assembly 103 includes a metal material and the second support assembly 103 is a metal support assembly. By using the first support assembly 102 and the second support assembly 103 to support the display panel 101, the effect of supporting the display panel 101 can be ensured, and reliability is high.

In addition, for the design of the second support assembly 103, please refer to the design of the first support assembly 102 described above. For example, the structure of the second support assembly 103 may be the structure in any of the above six embodiments. The structure of the second support assembly 103 may be the same as or different from that of the first support assembly 102, which is not limited in the embodiments of the present disclosure.

In the embodiments of the present disclosure, referring to FIG. 5, and FIG. 14 to FIG. 17, the display module 10 further includes a protective layer 104, a buffer layer 105, a polarizer (POL) 106, an optically clear adhesive (OCA) 107, and a cover film 108. The protective layer 104 and the buffer layer 105 are disposed between the non-display side of the display panel 101 and the first support assembly 102, and the protective layer 104 is farther from the first support assembly 102 than the buffer layer 105 is. The polarizer 106, the optically clear adhesive 107, and the cover film 108 are all disposed on the side of the display panel 101 distal from the first support assembly 102, and the polarizer 106, the optically clear adhesive 107, and the cover film 108 are sequentially laminated along a direction going away from the display panel 101. In addition, adjacent film layers are bonded by an optically clear adhesive or pressure sensitive adhesive (PSA). For example, in the embodiment of the present disclosure, only the optically clear adhesive 107 between the polarizer 106 and the cover film 108 is illustrated, and the polarizer 106 and the cover film 108 are bonded by the optically clear adhesive.

In some embodiments, the protective layer 104 is made from one or more of PI, PET, PE, and TPU. The cover film 108 is one or more of ultra-thin glass and transparent PI. The buffer layer 105 is foam double-sided tape.

In the embodiments of the present disclosure, the display panel 101 is a flexible display panel, for example, an organic light emitting diode (OLED) display panel. The display panel 101 includes a flexible substrate, a transistor device layer, a light emitting unit, an encapsulation film layer, and a touch film layer integrated on one side of the encapsulation film layer. The transistor device layer includes a plurality of thin film transistors (TFTs), and the plurality of TFTs form a pixel circuit of the display panel 101. The light emitting unit includes an anode layer, a light emitting layer, and a cathode layer that are sequentially laminated along a direction going away from the flexible substrate.

In summary, the embodiments of the present disclosure provide a display module. The display module includes a display panel and a first support assembly disposed on the non-display side of the display panel. By providing the first support assembly on the non-display side of the display panel, the display panel can be effectively supported, and the supporting effect is better. The thickness of each of the second support structure, the third support structure, and the fourth support structure for supporting the bending regions of the display panel in the first support assembly is less than the thickness of the first support structure, and/or, each of the second support structure, the third support structure, and the fourth support structure at least includes a target material having a lower elasticity modulus. Thus, the bending stress of the display module in the bending regions is smaller, which avoids the defects of film layer debonding, device failure and the like of the display module in the bending regions. Therefore, the yield of display module is higher, and the display effect is better.

Figures 17, 18:
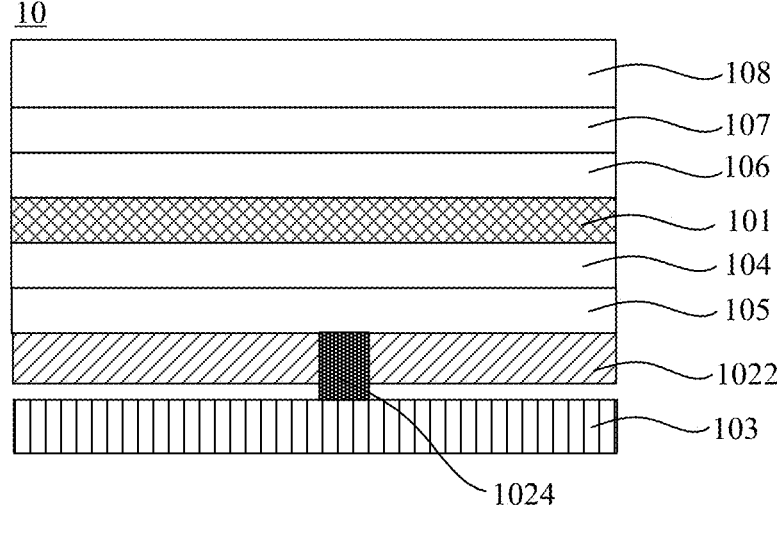
FIG. 17 is a cross-sectional view of still another display module along the direction BB in FIG. 3 according to some embodiments of the present disclosure.
FIG. 18 is a schematic structural diagram of a display device according to some embodiments of the present disclosure.

FIG. 18 is a schematic structural diagram of a display device according to some embodiments of the present disclosure. Referring to FIG. 18, the display device includes a power supply assembly 20 and the display module 10 according to the above embodiments. The power supply assembly 20 is connected to the display module 10, and is configured to supply power to the display module.

In some embodiments, the display device includes any product or component having a display function and a fingerprint identification function, such as an OLED display device, electronic paper, a mobile phone, a tablet computer, a television, a display, a notebook computer, a digital photo frame, or a navigator.

The terms used in the embodiments of the present disclosure are only for the purpose of explaining the embodiments and are not intended to limit the present disclosure. Unless otherwise defined, the technical or scientific terms used in the embodiments of the present disclosure shall have the ordinary meanings as understood by those of ordinary skill in the art to which the present disclosure belongs. "First", "second", "third", and other similar words used in the specification and claims of the present disclosure do not indicate any order, quantity, or importance, but are merely used to distinguish different components. Likewise, "a/an", "one" or other similar words are not intended to limit the quantity, but rather indicate the presence of at least one. "Including", "comprising" or other similar words means that the elements or objects stated before "include" or "comprise" encompass the elements or objects and equivalents thereof listed after "include" or "comprise", but does not exclude other elements or objects. "Connecting", "connected", or other similar words are not limited to physical or mechanical connections, but may include electrical connections, whether direct or indirect. "On", "under", "left", "right", and the like are merely used to indicate relative positional relationships, and when the absolute position of a described object changes, the relative position relationship may also change accordingly.

The descriptions above are merely optional embodiments of the present disclosure and are not intended to limit the present disclosure. Any modifications, equivalents, improvements, and the like made within the spirit and principles of the present disclosure should fall within the protection scope of the present disclosure.

What is claimed is:

1. A display module, wherein the display module comprises:

a display panel provided with a non-bending region, a first bending region, and a second bending region, wherein an extending direction of the first bending region intersects an extending direction of the second bending region, and an overlapping region of the first bending region and the second bending region is a double-bending region; and a first support assembly disposed on a non-display side of the display panel, wherein the first support assembly is of a plate-shaped structure, and the first support assembly comprises a first support structure, a second support structure, a third support structure, and a fourth support structure, wherein an orthographic projection of the first support structure on the display panel is in the non-bending region, an orthographic projection of the second support structure on the display panel is at least in the first bending region and is not in the double-bending region, an orthographic projection of the third support structure on the display panel is at least in the second bending region and is not in the double-bending region, and an orthographic projection of the fourth support structure on the display panel is at least in the double-bending region;

wherein a thickness of each of the second support structure, the third support structure, and the fourth support structure is less than a thickness of the first support structure, and/or a material of each of the second support structure, the third support structure, and the fourth support structure at least comprises a target material, an elasticity modulus of the target material being less than an elasticity modulus of a material of the first support structure; and the target material being acquired by filling and curing a liquid material.

2. The display module according to claim 1, wherein the thickness of the second support structure is equal to the thickness of the third support structure, and the thickness of the second support structure and the thickness of the third support structure are both less than the thickness of the first support structure; and the thickness of the fourth support structure is less than or equal to the thickness of the second support structure; and the material of the fourth support structure at least comprises the target material.

3. The display module according to claim 2, wherein the material of the second support structure and the material of the third support structure are both the same as the material of the first support structure, and the material of the fourth support structure is the target material; and a first groove is formed in a sidewall of the second support structure close to the fourth support structure, a second groove is formed in a sidewall of the third support structure close to the fourth support structure, and part of the fourth support structure is disposed in the first groove and the second groove.

4. The display module according to claim 3, wherein an orthographic projection of the first groove on a first reference plane has an axisymmetric shape, and an axis of the orthographic projection of the first groove on the first reference plane is overlapped with an axis of an orthographic projection of the second support structure on the first reference plane, wherein the first reference plane is perpendicular to a support surface of the first support assembly and parallel to an extending direction of the second support structure; and an orthographic projection of the second groove on a second reference plane has an axisymmetric shape, and an axis of the orthographic projection of the second groove on the second reference plane is overlapped with an axis of an orthographic projection of the third support structure on the second reference plane, wherein the second reference plane is perpendicular to the support surface and parallel to an extending direction of the third support structure.

5. The display module according to claim 3, wherein a length of the first groove along a direction perpendicular to a support surface of the first support assembly and a length of the second groove along the direction perpendicular to the support surface are less than or equal to the thickness of the second support structure.

6. The display module according to claim 2, wherein material of the second support structure and the material of the third support structure are both the same as the material of the first support structure, the material of the fourth support structure is the target material, and the fourth support structure is provided with a plurality of third grooves.

7. The display module according to claim 2, wherein the material of the second support structure, the material of the third support structure, and a material of a first part of the fourth support structure are all the same as the material of the first support structure, and a material of a second part of the fourth support structure is the target material; and the first part of the fourth support structure forms a plurality of fourth grooves, and the material of the second part of the fourth support structure is disposed in the plurality of fourth grooves.

8. The display module according to claim 7, wherein two adjacent rows of fourth grooves of the plurality of fourth grooves are staggered.

9. The display module according to claim 1, wherein the material of each of the second support structure, the third support structure, and the fourth support structure at least comprises the target material.

10. The display module according to claim 9, wherein the material of the second support structure, the material of the third support structure, and the material of the fourth support structure are all the target material; and a plurality of fifth grooves are formed in a sidewall of the first support structure close to the second support structure, and a plurality of sixth grooves are formed in a sidewall of the first support structure close to the third support structure, wherein part of the second support structure is disposed in the plurality of fifth grooves, and part of the third support structure is disposed in the plurality of sixth grooves.

11. The display module according to claim 10, wherein the plurality of fifth grooves and the plurality of sixth grooves all penetrate through the first support structure along a direction perpendicular to a support surface of the first support assembly.

12. The display module according to claim 11, wherein orthographic projections of the plurality of fifth grooves on the support surface and orthographic projections of the plurality of sixth grooves on the support surface have the same shape.

13. The display module according to claim 9, wherein a material of a first part of the second support structure and a material of a first part of the third support structure are the same as the material of the first support structure, and a material of a second part of the second support structure, a material of a second part of the third support structure, and the material of the fourth support structure are all the target material;

wherein the first part of the second support structure and the second part of the second support structure are laminated, and the first part of the third support structure and the second part of the third support structure are laminated.

14. The display module according to claim 9, wherein the thickness of the second support structure, the thickness of the third support structure, and the thickness of the fourth support structure are all equal, and are all less than or equal to the thickness of the first support structure.

15. The display module according to claim 9, wherein the material of the second support structure, the material of the third support structure, and the material of the fourth support structure are all the target material; and the thickness of the second support structure and the thickness of the third support structure are both less than or equal to the thickness of the first support structure, and the thickness of the fourth support structure is greater than or equal to the thickness of the second support structure.

16. The display module according to claim 1, wherein the first support structure is made from one of steel use stainless, titanium alloy, aluminum alloy, carbon fiber plates, polyethylene terephthalate, and polyimide.

17. The display module according to claim 16, wherein the target material is one of thermoplastic polyurethane elastomer rubber, polymethyl methacrylate, and organic silicon.

18. The display module according to claim 16, wherein the first support structure is made from polyethylene terephthalate or polyimide, and the display module further comprises: a second support assembly; wherein the second support assembly is of a plate-shaped structure, and the second support assembly is disposed on a side, distal from the display panel, of the first support assembly; and a material of the second support assembly at least comprises a metal material.

19. The display module according to claim 1, wherein the display panel is an organic light emitting diode display panel.

20. A display device, comprising: a power supply assembly and a display module; wherein the power supply assembly is configured to supply power to the display module; and the display module comprises:

a display panel provided with a non-bending region, a first bending region, and a second bending region, wherein an extending direction of the first bending region intersects an extending direction of the second bending region, and an overlapping region of the first bending region and the second bending region is a double-bending region; and a first support assembly disposed on a non-display side
of the display panel, wherein the first support assem-
bly is of a plate-shaped structure, and the first
support assembly comprises a first support structure,
a second support structure, a third support structure,
and a fourth support structure, wherein an ortho-
graphic projection of the first support structure on the
display panel is in the non-bending region, an ortho-
graphic projection of the second support structure on
the display panel is at least in the first bending region
and is not in the double-bending region, an ortho-
graphic projection of the third support structure on
the display panel is at least in the second bending
region and is not in the double-bending region, and
an orthographic projection of the fourth support
structure on the display panel is at least in the
double-bending region;

wherein a thickness of each of the second support struc-
ture, the third support structure, and the fourth support
structure is less than a thickness of the first support
structure, and/or a material of each of the second
support structure, the third support structure, and the
fourth support structure at least comprises a target
material, an elasticity modulus of the target material
being less than an elasticity modulus of a material of
the first support structure; and the target material being
acquired by filling and curing a liquid material.

\* \* \* \* \*